United States Patent
Ben-Rubi et al.

(10) Patent No.: US 9,484,114 B1
(45) Date of Patent: Nov. 1, 2016

(54) DECODING DATA USING BIT LINE DEFECT INFORMATION

(71) Applicant: SANDISK TECHNOLOGIES INC., Plano, TX (US)

(72) Inventors: Refael Ben-Rubi, Rosh Haayin (IL); Mark Shlick, Ganey-Tikva (IL); Moshe Cohen, Modi'in (IL)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/812,362

(22) Filed: Jul. 29, 2015

(51) Int. Cl.
*G11C 29/04* (2006.01)
*G11C 17/16* (2006.01)
*G11C 7/00* (2006.01)
*G11C 29/18* (2006.01)
*G11C 29/26* (2006.01)

(52) U.S. Cl.
CPC ............. *G11C 29/04* (2013.01); *G11C 7/00* (2013.01); *G11C 17/16* (2013.01); *G11C 29/18* (2013.01); *G11C 29/26* (2013.01)

(58) Field of Classification Search
CPC ......... G11C 7/00; G11C 17/16; G11C 29/04; G11C 29/18; G11C 29/26
USPC .............. 365/96, 185.02, 185.09, 200, 201
See application file for complete search history.

(56) References Cited

U.S. PATENT DOCUMENTS

| | | | | |
|---|---|---|---|---|
| 4,047,163 A | * | 9/1977 | Choate | G11C 29/78 365/104 |
| 5,999,463 A | * | 12/1999 | Park | G06F 11/00 365/200 |
| 7,724,573 B2 | * | 5/2010 | Tokiwa | G11C 16/06 365/185.09 |
| 2002/0196683 A1 | * | 12/2002 | Ohtani | G11C 29/72 365/200 |
| 2010/0107004 A1 | | 4/2010 | Bottelli et al. | |
| 2011/0002169 A1 | | 1/2011 | Li et al. | |
| 2014/0157087 A1 | | 6/2014 | Yurzola et al. | |

* cited by examiner

*Primary Examiner* — Tan T. Nguyen
(74) *Attorney, Agent, or Firm* — Toler Law Group, PC

(57) ABSTRACT

A data storage device includes a memory including a plurality of storage elements configured to store data. The plurality of storage elements includes a first group of storage elements and a second group of storage elements. The data storage device further includes a selection module configured to retrieve first bit line defect information affecting the first group of storage elements and to retrieve second bit line defect information affecting the second group of storage elements.

20 Claims, 4 Drawing Sheets

DECODING DATA USING BIT LINE DEFECT INFORMATION

FIELD OF THE DISCLOSURE

The present disclosure is generally related to decoding data using bit line defect information.

BACKGROUND

Data storage devices may include decoders, such as error correction code (ECC) engines, that are used to correct errors in data that is stored at memories of the data storage devices. Some ECC engines use soft bits that indicates probabilities that one or more bits are correct (or incorrect) in order to decode a representation of data and to correct one or more errors. One type of information used to generate the soft bits is bit line defect information. Bit line defect information may indicate which bit lines of a memory are "bad bit lines." Bad bit lines refer to bit lines that have defects (e.g., faults, flaws, and/or "errors"). At least some storage elements coupled to bad bit lines may have a high likelihood of storing incorrect data. A first type of bit line defect is referred to as a "closed defect" (e.g., a short). A closed defect occurs when one bit line is in contact with another bit line, causing all storage elements coupled to the two bit lines to have a high likelihood of storing incorrect data. A second type of bit line defect is referred to as an "open defect" (e.g., an "open"). An open defect occurs when there is a "break" in a bit line. Storage elements on one side of the break have a high likelihood of storing incorrect data, but storage elements on the other side of the break do not have an increased likelihood of storing incorrect data.

During fabrication and production of a data storage device, tests are performed to identify bad bit lines (e.g., bit lines having closed defects and open defects) at the memory. Bit line defect information for the entire memory is stored at the memory and is used to generate soft bits that are available to the ECC engine for use in decoding data. Because a bit line having an open defect is identified as a bad bit line, at least some storage elements (e.g., storage elements on one side of the break in the bit line) that do not have a high likelihood of storing incorrect data are incorrectly identified as having a high likelihood of storing incorrect data. Providing a decoder with soft bits that incorrectly identifies bits as having a high likelihood of being incorrect reduces an efficiency of the decoder, which increases processing time and power consumption of the decoder during the decoding process.

DETAILED DESCRIPTION

Particular implementations are described with reference to the drawings. In the description, common features are designated by common reference numbers throughout the drawings. As used herein, an ordinal term (e.g., "first," "second," "third," etc.) used to modify an element, such as a structure, a component, an operation, etc., does not by itself indicate any priority or order of the element with respect to another element, but rather merely distinguishes the element from another element having a same name (but for use of the ordinal term).

Figure 1:
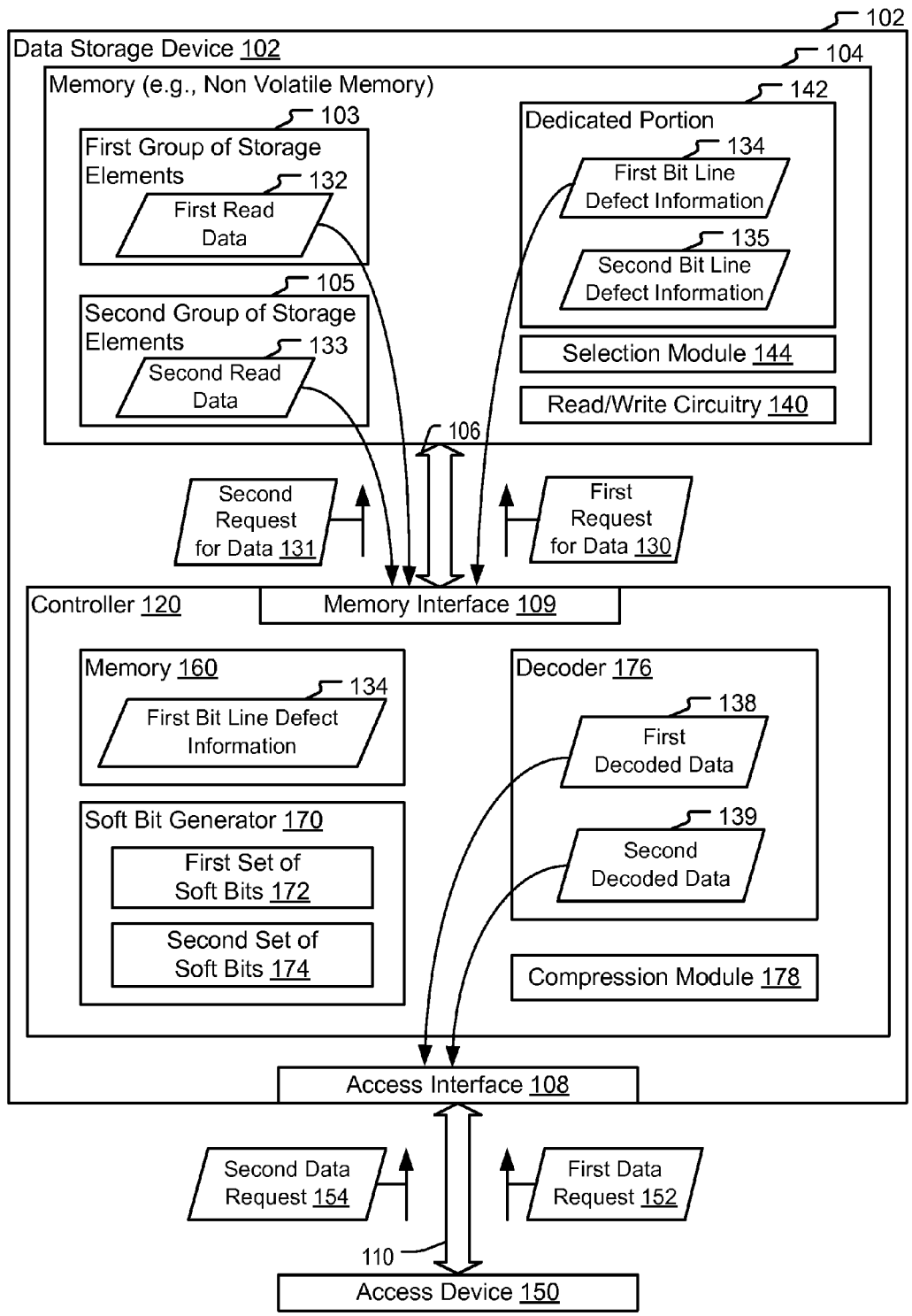
FIG. 1 is a block diagram of a particular illustrative example of a system configured to decode data stored at a group of storage elements of a memory of a data storage device using bit line defect information identifying bit lines having defects that affect the group of storage elements.

Referring to FIG. 1, a particular illustrative example of a system is depicted and generally designated 100. The system 100 includes a data storage device 102 and an access device 150. The data storage device 102 includes a controller 120 and a memory 104 that is coupled to the controller 120. In some implementations, the memory 104 is a non-volatile memory. In other implementations, the memory 104 is a volatile memory.

The memory 104 may include a plurality of storage elements configured to store data, such as a first group of storage elements 103 and a second group of storage elements 105. The first group of storage elements 103 and the second group of storage elements 105 may be coupled to a common set of bit lines. The memory 104 may also store bit line defect information associated with groups of storage elements. The memory 104 may include multiple dies, and each die may be organized into multiple groups of storage elements (e.g., blocks, logical pages, and/or physical pages). Bit line defect information may correspond to part of a die (e.g., a group of storage elements) instead of an entirety of the die. The bit line defect information that is associated with or corresponds to a particular group of storage elements of the memory 104 identifies one or more bit lines having defects (e.g., faults, flaws, or "errors") that affect (e.g., influence) the particular group of storage elements. In some implementations, the particular group of storage elements corresponds to a particular block of the memory 104. In other implementations, the particular group of storage elements may correspond to a word line of the memory 104 or a group of word lines of the memory 104. The bit line defect information does not identify bit lines that have defects that do not affect the particular group of storage elements. For example, the bit line defect information corresponding to the particular group of storage elements may identify a bit line that has an open defect only if the open defect affects storage elements in the particular group of storage elements of the memory 104 (e.g., if the open defect causes the storage elements in the particular group of storage elements to have a high likelihood of storing incorrect data). The bit line defect information indicating bit lines having defects that affect the particular group of storage elements may be used by the controller 120 to increase speed and reduce power consumption of a data decoding process, as further described herein.

The memory 104 may be configured to store bit line defect information for different groups of storage elements (e.g., blocks) of the memory 104. For example, a dedicated portion 142 of the memory 104 may store first bit line defect information 134 that is associated with the first group of storage elements 103 (e.g., a first block) of the memory 104 and the dedicated portion 142 may store second bit line defect information 135 that is associated with the second group of storage elements 105 (e.g., a second block) of the memory 104. The first bit line defect information 134 and the second bit line defect information 135 each identify bit lines that have defects (e.g., bit line errors) that affect the corresponding group of storage elements. For example, the first bit line defect information 134 may identify bit lines that have defects that affect the first group of storage elements 103. The first bit line defect information 134 may identify bit lines having "closed defects" (e.g., shorts) that affect an entire bit line and bit lines having "open defects" (e.g., breaks) that affect the first group of storage elements 103. An open defect that "affects" or "influences" the first group of storage elements 103 refers to a break in a bit line that is located on a particular side of the word lines in the first group of storage elements 103 such that storage elements coupled to the word lines have a high likelihood of storing incorrect data. The first bit line defect information 134 does not identify bit lines having open defects that do not affect the first group of storage elements 103. Open defects are further described with reference to FIG. 2. The second bit line defect information 135 may identify bit lines that have defects that affect the second group of storage elements 105. Because one or more open defects that affect the first group of storage elements 103 may not affect the second group of storage elements 105, or vice versa, the first bit line defect information 134 may be different than the second bit line defect information 135.

To retrieve the bit line defect information, the memory 104 includes a selection module 144. The selection module 144 may be configured to retrieve the first bit line defect information 134 affecting the first group of storage elements 103, and the selection module 144 may be configured to retrieve the second bit line defect information 135 affecting the second group of storage elements 105. In a particular implementation, the first bit line defect information 134 and the second bit line defect information 135 may be stored in a table at the memory 104. The selection module 144 may be configured to retrieve bit line defect information based on an address in a request for data received from the controller 120. To illustrate, the memory 104 may receive a first request for data 130 that indicates a first address where read data is stored at the memory 104. The selection module 144 may retrieve the first bit line defect information 134 in response to a determination that the first address corresponds to the first group of storage elements 103. The first bit line defect information 134 may be provided to the controller 120 with a representation first read data 132 stored at the first group of storage elements 103, and the controller 120 may use the first bit line defect information 134 to decode the representation of the first read data 132.

The controller 120 may be configured to receive bit line defect information that affects a particular group of storage elements and to use the bit line defect information during a decoding process of read data stored at the particular group of storage elements. The controller 120 may be configured to receive the first bit line defect information 134 from the memory 104 and to generate a first set of soft bits 172 (e.g., probability information) based on sensed information from the first group of storage elements 103 and the first bit line defect information 134. For example, a soft bit generator 170 of the controller 120 may be configured to generate the first set of soft bits 172 based on the first bit line defect information 134 and information indicating voltage levels sensed from the first set of storage elements 103. The controller 120 may also be configured to receive the second bit line defect information 135 from the memory 104 and to generate a second set of soft bits 174 (e.g., second probability information) based on the second bit line defect information 135 and sensed information from the second group of storage elements 105. Because the sets of soft bits 172 and 174 are generated based on bit line defect information that affects a particular group of storage elements, the sets of soft bits 172 and 174 may have a reduced number of bits that are incorrectly identified as having a high probability of being incorrect, as compared to sets of soft bits that are generated based on bit line defect information for an entirety of the memory 104.

The controller 120 may be configured to decode a representation of read data based on a corresponding set of soft bits. For example, the controller 120 may include a decoder 176 that is configured to generate first decoded data 138 based on the first set of soft bits 172 and the representation of the first read data 132. The decoder 176 may also be configured to generate second decoded data 139 based on the second set of soft bits 174 and the representation of the second read data 133. Because the first set of soft bits 172 are generated based on an identification of bit lines having defects that affect the first group of storage elements 103 (and not defects that do not affect the first group of storage elements 103), the first set of soft bits 172 may have fewer bits that are erroneously indicated as having a high likelihood of being incorrect as compared to a set of soft bits generated based on a list of all bit lines having defects, regardless of whether the defects affect the first group of storage elements 103. Reducing a number of bits that are incorrectly indicated as having a high likelihood of being incorrect increases efficiency of the decoder 176, thereby increasing speed and reducing power consumption of the decoder 176 during a process of generating the first decoded data 138. After generating the first decoded data 138 (and/or additional decoded data, as described further herein), the first decoded data 138 may be provided to the access device 150 in response to a request for data from the access device 150 (e.g., a request sent as part of a read operation).

The data storage device 102 and the access device 150 may be coupled via a connection (e.g., a communication path 110), such as a bus or a wireless connection. For example, the data storage device 102 may include an access interface 108 that enables communication via the communication path 110 between the data storage device 102 and the access device 150, such as when the access interface 108 is communicatively coupled to the access device 150. In some implementations, the data storage device 102 may be embedded within the access device 150, such as in accordance with a Joint Electron Devices Engineering Council (JEDEC) Solid State Technology Association Universal Flash Storage (UFS) configuration. Alternatively, the data storage device 102 may be removable from the access device 150 (i.e., "removably" coupled to the access device 150). As an example, the data storage device 102 may be removably coupled to the access device 150 in accordance with a removable universal serial bus (USB) configuration. In some implementations, the data storage device 102 may include or correspond to a solid state drive (SSD) which may be included in, or distinct from (and accessible to), the access device 150. For example, the data storage device 102 may include or correspond to an SSD, which may be used as an embedded storage drive (e.g., a mobile embedded storage drive), an enterprise storage drive (ESD), a client storage device, or a cloud storage drive, as illustrative, non-limiting examples. In some implementations, the data storage device 102 may be coupled to the access device 150 indirectly, e.g., via a network. For example, the data storage device 102 may be a network-attached storage (NAS) device or a component (e.g., a solid-state drive (SSD) device) of a data center storage system, an enterprise storage system, or a storage area network.

In some implementations, the data storage device 102 may be configured to be coupled to the access device 150 as embedded memory, such as eMMC® (trademark of JEDEC Solid State Technology Association, Arlington, Va.) and eSD, as illustrative examples. To illustrate, the data storage device 102 may correspond to an eMMC (embedded MultiMedia Card) device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof In some implementations, the data storage device 102 and the access device 150 may be configured to communicate using one or more protocols, such as an eMMC protocol, a universal flash storage (UFS) protocol, a universal serial bus (USB) protocol, a serial advanced technology attachment (SATA) protocol, and/or another protocol, as illustrative, non-limiting examples. The one or more protocols may include a standardized protocol and/or a non-standardized protocol, such as a proprietary protocol. In some implementations, the data storage device 102 and the access device 150 may be configured to communicate using dual channel communication (e.g., both devices may issue and receive commands from the other device).

The access device 150 may include a memory interface (not shown) and may be configured to communicate with the data storage device 102 via the memory interface to read data from and write data to the memory 104 of the data storage device 102. For example, the access device 150 may operate in compliance with a Joint Electron Devices Engineering Council (JEDEC) industry specification, such as a Universal Flash Storage (UFS) Access Controller Interface specification. As other examples, the access device 150 may operate in compliance with one or more other specifications, such as a Secure Digital (SD) Access Controller specification, as an illustrative, non-limiting example. The access device 150 may communicate with the memory 104 in accordance with any other suitable communication protocol.

The access device 150 may include a processor and a memory. The memory may be configured to store data and/or instructions that are executable by the processor. The memory may be a single memory or may include multiple memories, such as one or more non-volatile memories, one or more volatile memories, or a combination thereof. The access device 150 may issue one or more commands to the data storage device 102, such as one or more requests to erase data, read data from, or write data to the memory 104 of the data storage device 102. For example, the access device 150 may be configured to provide data to be stored at the memory 104 or to request data to be read from the memory 104. The access device 150 may include a mobile telephone, a music player, a video player, a gaming console, an electronic book reader, a personal digital assistant (PDA), a computer, such as a laptop computer or notebook computer, a network computer, a server, any other electronic device, or any combination thereof, as illustrative, non-limiting examples.

The controller 120 may be configured to receive data and/or instructions from the access device 150 and to provide data and/or instructions to the memory 104. The controller 120 is coupled to the memory 104 via a bus 106, an interface (e.g., interface circuitry, such as a memory interface 109), another structure, or a combination thereof. The controller 120 and the memory 104 may exchange information via the bus 106, the memory interface 109, or a combination thereof. For example, one or more of representations of read data, bit line defect information, requests for data, and other data or instructions may be exchanged via the bus 106, the memory interface 109, or a combination thereof, may be exchanged between the controller 120 and the memory 104.

The controller 120 is configured to receive data and instructions from the access device 150 and to send data to the access device 150. For example, the controller 120 may send data to the access device 150 via the access interface 108, and the controller 120 may receive data from the access device 150 via the access interface 108. The controller 120 is configured to send data and commands to the memory 104 and to receive data from the memory 104. For example, the controller 120 is configured to send data and a write command to cause the memory 104 to store data to a specified address of the memory 104. The write command may specify a physical address of storage element(s) within a portion (e.g., a block) of the memory 104 that is to store the data. The controller 120 is configured to send a read command to the memory 104 to access data from a specified address of the memory 104. The read command may specify the physical address of storage element(s) of a portion (e.g., a block) of the memory 104 (e.g., a physical address of a word line of coupled to the storage elements).

The read command may be based on a data request received from the access device 150. For example, the access device 150 may send data requests to the controller 120 via the communication path 110, the access interface 108, or a combination thereof. Based on the data requests, the controller 120 is configured to send requests for data (e.g., read commands) to the memory 104 and to receive representations of data from the memory 104 in response to the requests for data. The controller 120 is configured to decode the representations of data based on the bit line defect information, as further described herein. The controller 120 is also configured to send decoded data to the access device 150 via the communication path 110, the access interface 108, or a combination thereof.

The memory 104 of the data storage device 102 may include a non-volatile memory. In a particular implementation, the memory 104 includes a Flash memory. The memory 104 includes multiple storage elements configured to store data. The memory 104 may have a two-dimensional (2D) memory configuration. Alternatively, the memory 104 may have another configuration, such as a three-dimensional (3D) memory configuration. For example, the memory 104 may include a three-dimensional (3D) memory configuration that is monolithically formed in one or more physical levels of arrays of memory cells having an active area disposed above a silicon substrate. In other implementations, the memory 104 may include a volatile memory. The memory 104 may include one memory die or multiple memory dies. In some implementations, the memory 104 includes circuitry associated with operation of the storage elements (e.g., the memory cell).

The memory 104 may include multiple groups of storage elements. For example, the memory 104 may include the first group of storage elements 103 and the second group of storage elements 105. The multiple groups of storage elements may include or correspond to particular groupings of the memory 104. In a particular implementation, the multiple groups of storage elements correspond to multiple blocks of the memory 104. For example, the first group of storage elements 103 corresponds to a first block of the memory 104, and the second group of storage elements 105 corresponds to a second block of the memory 104. In other implementations, the multiple groups of storage elements may correspond to other groupings, such as logical pages or physical pages. If the memory 104 includes multiple dies, each die may be organized into multiple groups of storage elements. In a particular implementation, each block of the memory 104 includes storage elements coupled to 128 word lines. In other implementations, blocks of the memory 104 may include more than or fewer than 128 word lines. In a particular implementation, the memory 104 includes or corresponds to a flash memory that includes multiple blocks, the first group of storage elements 103 includes a first block of the multiple blocks, and the second group of storage elements 105 includes a second block of the multiple blocks. Although an example of the memory 104 having two groups of storage elements is described, such example is for illustrative purposes only. In other implementations, the memory 104 may include more than two groups of storage elements (e.g., blocks) or may include a single group of storage elements (e.g., block).

The memory 104 also includes the dedicated portion 142 that is configured to store bit line defect information. For example, the dedicated portion 142 may store the first bit line defect information 134 and the second bit line defect information 135. In a particular implementation, the bit line defect information may be stored in a table (e.g., a table of bit line defect information). A first entry in the table may include the first bit line defect information 134, and a second entry in the table may include the second bit line defect information 135. In other implementations, the bit line defect information may be stored in a different data structure, such as a list, as one non-limiting example. In some implementations, the bit line defect information may be compressed, as further described herein. In some implementations, each group of storage elements of the memory 104 may have corresponding bit line defect information stored at the dedicated portion 142. If the memory 104 includes multiple dies, groups of storage elements from multiple dies may have corresponding bit line defect information stored at the dedicated portion 142. Stated another way, bit line defect information may correspond to a part of a die (e.g., a group of storage elements of the die) instead of an entirety of the die.

In a particular implementation, the dedicated portion 142 includes one or more read-only memory (ROM) fuses. In this implementation, the bit line defect information (e.g., the first bit line defect information 134 and the second bit line defect information 135) may be generated during one or more factory tests during fabrication of the data storage device 102. For example, after welding the memory 104 to a printed circuit board (PCS) of the data storage device 102, tests may be performed for each group of storage elements of the memory 104 to determine which bit lines have defects (e.g., faults, flaws, or errors) that affect the tested group of storage elements. After one or more bit lines having defects that affect the tested group of storage elements have been identified, one or more ROM fuses may be "blown" to store information identifying the bit lines. The information may be read by the memory 104, such as the selection module 144, as part of retrieving the bit line defect information corresponding to a particular group of storage elements of the memory 104. Although the one or more ROM fuses are described as being included in the memory 104, such description is not limiting and is for illustrative purposes only. In other implementations, the one or more ROM fuses may be part of a read-only (ROM) memory that is separate from the memory 104, or the one or more ROM fuses may be included in the controller 120.

Additionally or alternatively, the dedicated portion 142 includes one or more single-level cell (SLC) storage elements. In this implementation, the bit line defect information may be generated during one or more tests during production of the data storage device 102. For example, production tests may be performed for each group of storage elements of the memory 104 to determine which bit lines have defects that affect the tested group of storage elements. To illustrate, data having a particular pattern may be written to a group of storage elements of the memory 104, and a representation of the data stored at the group of storage elements may be read and compared to the data that was written (e.g., to the particular pattern). Based on the comparison, bit lines having defects that affect the group of storage elements may be identified. The production test may be performed on each group of storage elements of the memory 104 to determine bit line defect information corresponding to each group of storage elements. In another implementation, the bit line defect information may be generated or updated during the lifetime of the data storage device 102. For example, the controller 120 or circuitry in the memory 104 may be configured to initiate one or more tests to determine bit line defect information corresponding to each group of storage elements of the memory 104. The tests may be the same as the tests described above, except that the tests are performed during the production of the data storage device 102, and the test for each group of storage elements of the memory 104 may determine one or more bit lines having defects that affect the tested group of storage elements.

The bit line defect information (e.g., the first bit line defect information 134 and the second bit line defect information 135) identifies bit lines having defects that affect a corresponding group of storage elements of the memory 104. For example, the first bit line defect information 134 identifies bit lines having defects that affect the first group of storage elements 103, and the second bit line defect information 135 identifies bit lines having defects that affect the second group of storage elements 105. In a particular implementation, the bit line defect information includes an identifier of each bit line that is identified as having a defect that affects the corresponding group of storage elements of the memory 104. In another implementation, the bit line defect information includes up to a particular number of identifiers of bit lines that are identified as having a defect that affects the corresponding group of storage elements. In some implementations, the groups of storage elements of the memory 104 may include blocks of the memory 104. In other implementations, the groups of storage elements may be smaller than blocks. For example, in some implementations, bit line defect information may be generated for each word line in the memory 104, or for other groups of storage elements of the memory 104 that are smaller than blocks. In still other implementations, the groups of storage elements may be larger than blocks, such that less bit line defect information is stored in the memory 104 and the dedicated portion 142 may be smaller, thus reducing a size of the memory 104.

In some implementations, the bit line defect information (e.g., the first bit line defect information 134 and the second bit line defect information 135) may identify at most (e.g., a maximum of) a particular number of bit lines. In a particular implementation, the bit line defect information identifies up to twenty bit lines having defects that affect a corresponding group of storage elements of the memory 104. For example, if twenty or more bit lines have defects that affect a corresponding group of storage elements of the memory 104, the bit line defect information indicates twenty bit lines. If less than twenty bit lines have defects that affect the corresponding group of storage elements of the memory 104, the bit line defect information identifies each of the bit lines having defects that affect the corresponding group of storage elements of the memory 104. In other implementations, the maximum number of bit lines identified by the bit line defect information may be more than or fewer than twenty bit lines. The number of bit lines identified by the bit line defect information may be selected during design of the data storage device 102 based on a target size of the dedicated portion 142 of the memory 104, a target speed or operating power of the decoder 176, or a combination thereof. To illustrate, increasing a number of bit lines identified by the bit line defect information may increase a size of the dedicated portion 142 of the memory 104 used to store the bit line defect information or may reduce a speed of the decoder 176 during a decoding process that is based on the bit line defect information.

The bit line defect information (e.g., the first bit line defect information 134 and the second bit line defect information 135) may identify bit lines having multiple types of defects. As one example, the bit line defect information may identify bit lines having "closed defects" (e.g., shorts). A closed defect occurs when one bit line is in contact with another bit line, causing all storage elements coupled to the two bit lines to have a high likelihood of storing incorrect data. As another example, the bit line defect information may identify bit lines having "open defects" (e.g., "opens"). An open defect occurs when there is a "break" (e.g., an open) in a word line. Storage elements coupled to the bit line on one side of the break have a high likelihood of storing incorrect data, but storage elements coupled to the bit line on the other side of the break do not have an increased likelihood of storing incorrect data. The bit line defect information corresponding to a particular group of storage elements of the memory 104 includes an identifier of a bit line having an open defect if the word lines of the particular group of storage elements, and the storage elements coupled to the word lines, are on the side of the break that is affected by the break. If a break occurs in a bit line, the bit line may be defective on one side of the break but not on the other side of the break. Storage elements coupled to word lines on the side of the break that is affected (e.g., the side that is defective) have a high likelihood of storing incorrect data, and storage elements coupled to word lines on the other side of the break do not have an increased likelihood of storing incorrect data. Because the bit line defect of data stored in storage elements of the particular group of storage elements of the memory 104 decreases if bit lines have breaks that affect the particular group of storage elements, the bit line defect information corresponding to the particular group of storage elements indicates bit lines having breaks that affect the particular group of storage elements and not bit lines having breaks that do not affect the particular group of storage elements. In other examples, the bit line defect information identifies bit lines having other types of defects that affect the corresponding group of storage elements of the memory 104.

The memory 104 may include support circuitry, such as read/write circuitry 140, to support operation of the memory 104. Although depicted as a single component, the read/write circuitry 140 may be divided into separate components of the memory 104, such as read circuitry and write circuitry. The read/write circuitry 140 may be configured to read a representation of data from or to write data to one or more group of storage elements of the memory 104 based on requests from the controller 120. For example, the read/write circuitry 140 may be configured to sense read data stored at a particular group of storage elements in response to a request for the read data from the controller 120. To illustrate, the controller 120 may send a first request for read data 130 to the memory 104. The first request for read data 130 may indicate an address that corresponds to storage element (s) within the first group of storage elements 103 of the memory 104. In response to the first request for read data 130, the read/write circuitry 140 may sense first read data 132 that is stored at the first group of storage elements 103 and, and a representation of the first read data 132 may be provided to the controller 120. The representation of the first read data 132 may be provided with the first bit line defect information 134, as further described herein.

The memory 104 may include selection module 144 that is configured to retrieve bit line defect information from the dedicated portion 142 in response to an address included in a request received from the controller 120. In some implementations, the selection module 144 may include or correspond to selection circuitry, such as digital logic circuitry, configured to perform the operations of the selection module 144. In another implementation, the selection module 144 may include or correspond to an application-specific integrated circuit (ASIC), a field-programmable gate array (FPGA) device, or other dedicated hardware configured to perform the operation of the selection module 144. In another implementation, the selection module 144 may include or correspond to processor-executable instructions that are executed by a processor or a controller, as non-limiting examples, to perform the operations of the selection module 144.

The selection module 144 may retrieve bit line defect data based on an address in a request for data. To illustrate, the memory 104 may receive, from the controller 120, a first request for data 130 that indicates a first address that stores read data being requested. The selection module 144 may be configured to retrieve the first bit line defect information 134 from the dedicated portion 142 of the memory 104 in response to the first address corresponding to the first group of storage elements 103. To further illustrate, the controller 120 may send a second request for data 131 to the memory 104, and the second request for data 131 may indicate a second address that stores read data being requested. The selection module 144 may be configured to retrieve the second bit line defect information 135 from the dedicated portion 142 based on the second address corresponding to the second group of storage elements 105. In this manner, the selection module 144 is configured to retrieve different bit line defect information based on requests for data that indicate addresses that correspond to different group of storage elements of the memory 104. After the bit line defect information is retrieved, the bit line defect information may be provided to the controller 120.

In some implementations, the request for data may include a request for the bit line defect information. For example, the first request for data 130 may include a request for the first bit line defect information 134. In these implementations, the selection module 144 may retrieve the first bit line defect information 134 in response to the first request for data 130 including the request for the first bit line defect information 134. If the memory 104 receives an additional request for data that does not include a request for bit line defect information, the selection module 144 does not retrieve any bit line defect information based on the additional request for data. In these implementations, the controller 120 may determine whether or not to request bit line defect information, as further described herein, and the selection module 144 may retrieve bit line defect information if requested by the controller 120. In other implementations, requests for data do not include requests for bit line defect information, and the selection module 144 automatically retrieves bit line defect information in response to each request for data based on an address indicated by the request for data. In these implementations, bit line defect information is retrieved and provided to the controller 120 in response to each request for data.

In some implementations, the selection module 144 may be configured to retrieve and provide the bit line defect information concurrently (e.g., in parallel), or substantially concurrently, with the read/write circuitry 140 sensing and providing the representation of read data. For example, the read/write circuitry 140 may sense the first read data 132 and provide the representation of the first read data 132 to the controller 120 during a first time period, and the selection module 144 may retrieve and provide the first bit line defect information 134 to the controller 120 during a second time period. At least a portion of the second time period may overlap the first time period. In a particular implementation, the first bit line defect information 134 is provided to the controller 120 before completion of the sensing of the first read data 132, such that the controller 120 is enabled to perform one or more operations (e.g., a decompression operation) using the first bit line defect information 134 prior to receiving the representation of the first read data 132.

In addition to the memory 104, the data storage device 102 includes the controller 120. The controller 120 may include a second memory 160, a soft bit generator 170, a decoder 176, and a compression module 178. In a particular implementation, the second memory 160 is a volatile memory. The controller 120 may be configured to store bit line defect information in the second memory 160. For example, the controller 120 may store the first bit line defect information 134 at the second memory 160.

In some implementations, the second memory 160 may act as a cache for bit line defect information. In these implementations, the controller 120 may be configured to store bit line defect information in the second memory 160 (e.g., the volatile memory) upon receipt of the bit line defect information. For example, the controller 120 may store the first bit line defect information 134 in the second memory 160 in response to receipt of the first bit line defect information 134 from the memory 104.

In a particular implementation, the controller 120 may be configured to suppress storage of additional bit line defect information in the second memory 160 if an address of a request for additional read data corresponds to storage element(s) within the most recently accessed group of storage elements. For example, after storing the first bit line defect information 134 in the second memory 160, the controller 120 may determine whether the address indicated by the second request for data 131 corresponds to storage element(s) within the first group of storage elements 103 (e.g., the most recently accessed group of storage elements). Based on a determination that the address indicated by the second request for data 131 does not correspond to storage element(s) within the first group of storage elements 103 (e.g., the address corresponds to a different group of storage elements), the controller 120 includes a request for bit line defect information in the second request for data 131. In response to inclusion of the request for bit line defect information in the second request for data 131, the controller 120 receives the second bit line defect information 135 and stores the second bit line defect information 135 at the second memory 160.

As another example, after storing the first bit line defect information 134 in the second memory 160, the controller 120 may send a request for additional data (not illustrated) to the memory 104 and may receive additional bit line defect information (not illustrated). The controller 120 may determine that an address indicated by the additional request for data corresponds to storage element(s) within the first group of storage elements 103 (e.g., the most recently accessed group of storage elements). Based on a determination that the address indicated by the additional request for data corresponds to storage element(s) of the first group of storage elements 103, the controller 120 suppresses storage of the additional bit line defect information at the second memory 160. Because the additional request for data corresponds to the same group of storage elements (e.g., the first group of storage elements 103) as the first request for data 130, the additional bit line defect information is the same as the first bit line defect information 134, which is already stored at the second memory 160. Instead of storing a copy of the first bit line defect information 134 at the second memory 160, the controller 120 accesses the first bit line defect information 134 from the second memory 160 for use in data decoding. In an alternate implementation, if the address indicated by the additional request for data corresponds to storage element(s) of the first group of storage elements 103, the controller 120 does not include (e.g., suppresses inclusion of) a request for bit line defect information in the additional request for data. In this implementation, the additional bit line defect information is not received at the controller 120 based on the additional request for data not including a request for bit line defect information.

In some implementations, the controller 120 may include a request for bit line defect information in each request for data, or the controller 120 may receive bit line defect information in each response to request for data. To illustrate, after storing the first bit line defect information 134 in the second memory 160, the controller 120 may send the second request for data 131 to the memory 104. In response to the second request for data 131, the controller 120 receives the second bit line defect information 135. The controller 120 may be configured to determine whether the address indicated by the second request for data 131 corresponds to storage element(s) within the first group of storage elements 103 (e.g., the most recently accessed group of storage elements of the memory 104). In response to the controller 120 determining that the address indicated by the second request for data 131 does not correspond to storage element(s) within the first group of storage elements 103, the controller 120 stores the second bit line defect information 135 in the second memory 160. In a particular implementation, the second memory 160 is configured to overwrite bit line defect information stored at the second memory 160 each time bit line defect information is stored, and the controller 120 overwrites the first bit line defect information 134 with the second bit line defect information 135. Alternatively, the controller 120 may store the second bit line defect information 135 in addition to the first bit line defect information 134. In a particular implementation, if the second memory 160 becomes full, bit line defect information may be overwritten using a least recently used (LRU) scheme, as one non-limiting example.

The soft bit generator 170 may be configured to generate sets of soft bits based on bit line defect information. A set of soft bits may indicate the probability that a corresponding set of bits is correct (or incorrect). For example, a set of soft bits associated with a representation of read data may indicate probabilities that bits of the representation of read data are correct. In some implementations, the set of soft bits may be generated based on bit line defect information. In other implementations, the set of soft bits may be generated based on bit line defect information and sensed data from the memory 104. For example, in addition to sensing the first read data 132 from the first group of storage elements 103, the memory 104 may also sense whether charges stored at storage elements are within an overlap between thresholds corresponding to different data values. Storage elements that store these charges may have a high likelihood of being incorrect. Sets of soft bits may be generated based on the sensed data to indicate a probability that bits in the representation of the first read data 132 are correct (or incorrect).

The sets of soft bits may be generated further based on bit line defect data. The soft bit generator 170 may be configured to generate a set of soft bits associated with a representation of read data based on bit line defect information corresponding to the representation of read data. For example, the soft bit generator 170 may generate a first set of soft bits 172 associated with the representation of the first read data 132 based on sensed information and based on the first bit line defect information 134. As another example, the soft bit generator 170 may generate a second set of soft bits 174 associated with the representation of the second read data 133 based on sensed information and based on the second bit line defect information 135. As described above, the first bit line defect information 134 indicates bit lines that have defects that affect storage elements of the first group of storage elements 103. Thus, soft bits associated with particular bits of the representation of the first read data 132 (e.g., bits that are stored at storage elements coupled to the bit lines that have the defects) may indicate that that particular bits have a high likelihood of being incorrect. The sets of soft bits may be used by the decoder 176 to decode the representations of the read data received from the memory 104. For example, the first set of soft bits 172 may be used to decode the representation of the first read data 132, and the second set of soft bits 174 may be used to decode the representation of the second read data 133.

The decoder 176 may be configured to decode representations of data received from the memory 104. The decoder 176 may be part of or included in an error correction code (ECC) engine. The ECC engine may be configured to receive data and to generate one or more error correction code (ECC) codewords (e.g., including a data portion and a parity portion) based on the data. For example, the ECC engine may receive write data (e.g., based on a write command from the access device 150) and may generate a codeword. To illustrate, the ECC engine may include an encoder configured to encode the data using an ECC encoding technique. The ECC engine may include a Reed-Solomon encoder, a Bose-Chaudhuri-Hocquenghem (BCH) encoder, a low-density parity check (LDPC) encoder, a turbo encoder, an encoder configured to encode the data according to one or more other ECC techniques, or a combination thereof, as illustrative, non-limiting examples.

The ECC engine may include a decoder (e.g., the decoder 176) configured to decode a representation of data read from the memory 104 to detect and correct bit errors that may be present in the representation of the data. For example, the decoder 176 may correct a number of bit errors up to an error correction capability of an ECC technique used by the decoder 176. To decode the representation of data, the decoder 176 may use one or more sets of soft bits from the soft bit generator 170. For example, the decoder 176 may generate first decoded data 138 based on the representation of the first read data 132 and the first set of soft bits 172. As another example, the decoder 176 may generate second decoded data 139 based on the representation of the second read data 133 and the second set of soft bits 174.

In some implementations, the bit line defect information is compressed prior to storage at the dedicated portion 142 of the memory 104. In implementations where the controller 120 generates and sends the bit line defect information (e.g., the first bit line defect information 134 and the second bit line defect information 135) to the memory 104, the compression module 178 is configured to perform a data compression operation on the first bit line defect information 134 and the second bit line defect information 135 prior to storage of the first bit line defect information 134 and the second bit line defect information 135 in the second memory 160. In a particular implementation, the data compression operation may be a "start-run" compression operation. In other implementations, the data compression operation may be a different compression operation. The compression module 178 is configured to perform a data decompression operation on the first bit line defect information 134 and the second bit line defect information 135 prior to generating the first set of soft bits 172 and the second set of soft bits 174. In a particular implementation, the data decompression operation may be a start-run decompression operation. In other implementations, the data decompression operation may be a different decompression operation.

During operation, the data storage device 102 may receive commands from the access device 150. For example, the data storage device 102 may receive a first data request 152 from the access device 150. The first data request 152 may include an address associated with storage element(s) within the first group of storage elements 103 of the memory 104. For example, the first data request 152 may include a logical address, a physical address, a virtual address, or some other identifier of one or more storage elements in the first group of storage elements 103 of the memory 104. The controller 120 may generate the first request for data 130 based on the first data request 152 and may send the first request for data 130 to the memory 104. In response to receiving the first request for data 130, the read/write circuitry 140 may begin a sensing operation to read the first read data 132 from the first group of storage elements 103. Additionally, the selection module 144 may retrieve the first bit line defect information 134 from the dedicated portion 142 based on an address in the first request for data 130 indicating a location in the first group of storage elements 103. In some implementations, the read/write circuitry 140 and the selection module 144 may operate concurrently (e.g., in parallel), or substantially concurrently. The controller 120 may receive the first bit line defect information 134 and a representation of the first read data 132 in response to sending the first request for data 130.

The first bit line defect information 134 may be stored at the second memory 160 if the first group of storage elements 103 (e.g., a group of storage elements of the memory 104 that corresponds to the first bit line defect information 134) is different than a previously accessed group of storage elements of the memory 104. If the first group of storage elements 103 is not different than the previously accessed group of storage elements, the first bit line defect information 134 is not saved at the second memory 160.

Additionally, the first bit line defect information 134 may be provided to the soft bit generator 170. In some implementations, the compression module 178 may receive the first bit line defect information and may decompress the first bit line defect information 134 prior to providing the decompressed first bit line defect information 134 to the soft bit generator 170. Delay associated with the compression module 178 does not exceed the delay associated with the read/write circuitry 140 providing the representation of the first read data 132 (and the additional sensed information) to the controller 120 and thus does not introduce additional delay to the decoding process. In response to receiving the first bit line defect information 134, the soft bit generator 170 may generate the first set of soft bits 172 based on the first bit line defect information 134 (and based on sensed data from the first group of storage elements 103, as described above). The first set of soft bits 172 may indicate probabilities that bits of the representation of the first read data 132 are correct (or incorrect).

The representation of the first read data 132 and the first set of soft bits 172 may be provided to the decoded 176, and the decoder 176 may generate the first decoded data 138 based on the representation of the first read data 132 and the first set of soft bits 172. For example, the decoder 176 may perform a decoding operation and one or more error correction operations on the representation of the first read data 132 based on the first set of soft bits 172. In a particular implementation, the decoder 176 is an LPC decoder. In this implementation, because the first set of soft bits is more accurate (e.g., at least some bits are not incorrectly identified as having a high probability of being incorrect), the decoder 176 may converge faster than if the decoder 176 decodes the representation of the first read data 132 using soft bits based on bit line defect information for the entirety of the memory 104. The first decoded data 138 may be provided by the controller 120 to the access device 150 in response to the first data request 152.

The controller 120 may also receive a second data request 154 from the access device 150. In response to the second data request 154, the controller 120 may send the second request for data 131 to the memory 104. The read/write circuitry 140 may sense the second read data 133 at the second group of storage elements 105 and may provide a representation of the second read data 133 to the controller 120. The selection module 144 may retrieve the second bit line defect information 135 and may provide the second bit line defect information 135 to the controller 120. The controller 120 may receive the second bit line defect information 135 and the representation of the second read data 133 in response to sending the second request for data 131. Because the second bit line defect information 135 corresponds to a different group of storage elements of the memory 104, the second bit line defect information 135 may be different than the first bit line defect information 134.

The soft bit generator 170 may generate the second set of soft bits 174 based on the second bit line defect information 135 and sensed information associated with the representation of the second read data 133. The decoder 176 may generate the second decoded data 139 based on the second set of soft bit 174 and the representation of the second read data 133. Because the second set of soft bits 174 is more accurate (e.g., at least some bits are not incorrectly identified as having a high likelihood of being incorrect), the decoder 176 may converge faster than if the decoder 176 decodes the representation of the second read data 133 using soft bits based on bit line defect information for the entirety of the memory 104. The controller 120 may provide the second decoded data 139 to the access device 150 based on the second data request 154.

Although one or more components of the data storage device 102 have been described with respect to the controller 120, in other implementations certain components may be included in the memory 104. For example, one or more of the second memory 160, the soft bit generator 170, the decoder 176, and/or the compression module 178 may be included in the memory 104. Alternatively, or in addition, one or more functions as described above with reference to the controller 120 may be performed at or by the memory 104. For example, one or more functions of the second memory 160, the soft bit generator 170, the decoder 176, and/or the compression module 178 may be performed by components and/or circuitry included in the memory 104. Alternatively, or in addition, one or more components of the data storage device 102 may be included in the access device 150. For example, one or more of the second memory 160, the soft bit generator 170, the decoder 176, and/or the compression module 178 may be included in the access device 150. Alternatively, or in addition, one or more functions as described above with reference to the controller 120 may be performed at or by the access device 150. As an illustrative, non-limiting example, the access device 150 may be configured to decode a representation of read data based on bit line defect information (e.g., based on soft bits generated based on the bit line defect information) from the memory 104. In some implementations, the components of the controller 120, the memory 104, and/or the access device 150 may include or correspond to dedicated circuitry, an application-specific integrated circuit (ASIC), a field-programmable gate array (FPGA) device, or other dedicated hardware configured to perform the operation of the corresponding component. In other implementation, the components may include or correspond to instructions that are executable by a processor or a controller, as non-limiting examples, to perform the operations of the corresponding component.

Because the bit line defect information for each group of storage elements of the memory 104 identifies bit lines that have defects affecting the group of storage elements, the bit line defect information (e.g., the first bit line defect information 134, the second bit line defect information 135, etc.) may be more accurate for the group of storage elements than bit line defect information for the entirety of the memory 104. Because the bit line defect information is more accurate, the number of bits indicated as being incorrect by soft bits generated based on the bit line defect information may be less than for soft bits generated based on the bit line defect information for the entirety of the memory 104. By providing more accurate soft bits to the decoder 176, efficiency of the decoder 176 is increased, thereby increasing speed and reducing power consumption of the decoder 176. Additionally, as the data storage device 102 reaches an end of life, storage elements begin to fail. Failure of storage elements may cause the number of errors in data read from the memory 104 to increase and other decoders may be unable to decode data having the increased number of errors. However, because the decoder 176 receives soft bits that do not incorrectly identify at least some bits as having a high likelihood of being incorrect, the decoder 176 is able to use the bits to decode the data with the increased number of errors, thereby prolonging a useful life of the data storage device 102.

Figure 2:
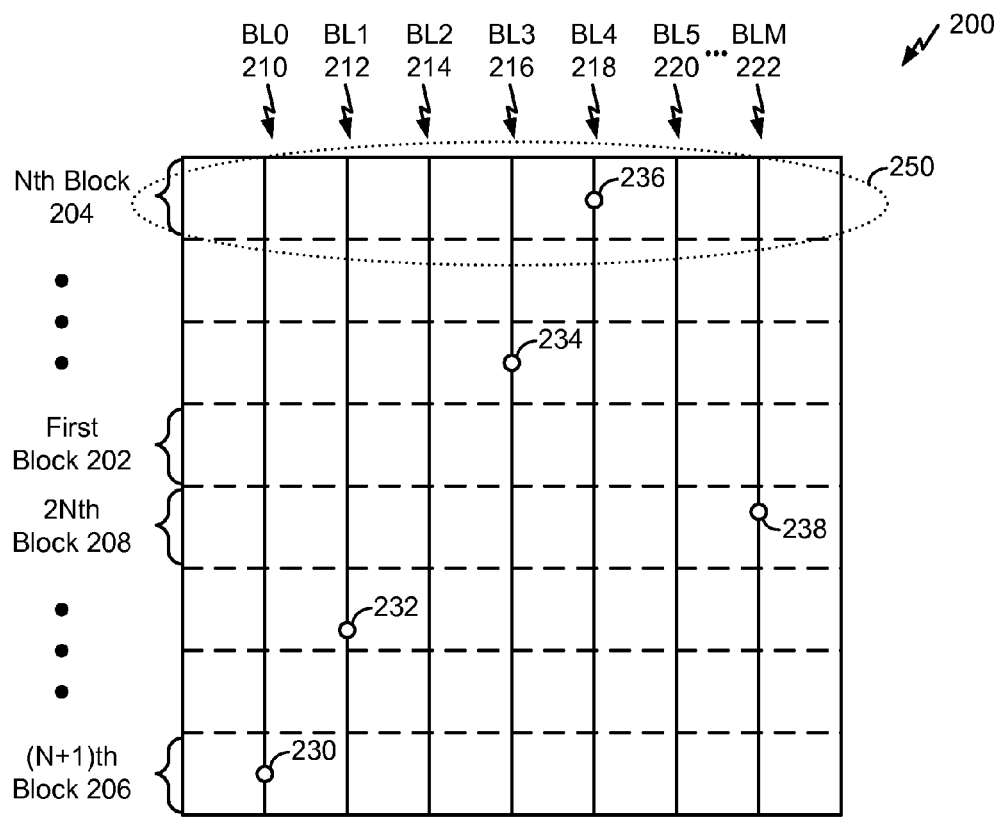
FIG. 2 is a block diagram that illustrates multiple blocks of the memory 104 of FIG. 1 and multiple bit lines having open defects.
Figure 2:
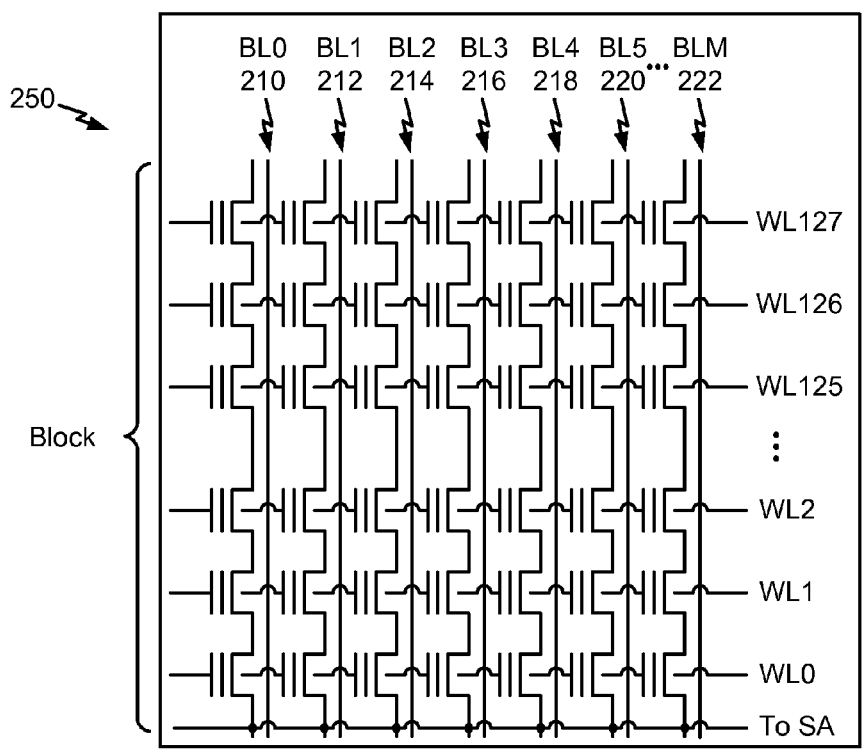

Referring to FIG. 2, a diagram 200 illustrates multiple blocks of the memory 104 of FIG. 1 and multiple bit lines having open defects. The diagram 200 illustrates an example of the memory 104 that includes multiple blocks and is not limiting. A first block of the multiple memory blocks may correspond to the first group of storage elements 103 and a second block of the multiple memory blocks may correspond to the second group of storage elements 105. In other implementations, the memory 104 may include more than or fewer than the number of blocks illustrated in FIG. 2, and/or the memory 104 may include different blocks (with different word lines and bit lines) than illustrated in FIG. 2.

The memory 104 may include a plurality of blocks, such as a first block 202, an Nth block 204, an (N+1)th block 206, and a 2Nth block 208. The plurality of blocks may include 2N blocks. In a particular implementation, 2N is one thousand. In other implementations, the number of blocks may be more than or fewer than one thousand. Each block may include a plurality of transistors, and each transistor may be coupled to one word line of a plurality of word lines and to one bit line a plurality of bit lines. Each transistor may be a storage element of the memory 104 of FIG. 1 and may be configured to store an electrical charge that represents a data value.

The plurality of bit lines may include a first bit line 210 (BL0), a second bit line 212 (BL1), a third bit line 214 (BL2), a fourth bit line 216 (BL3), a fifth bit line 218 (BL4), a sixth bit line 220 (BL5), and an Mth bit line 222 (BLM). In a particular implementation, the plurality of word lines may include 128 word lines. FIG. 2 includes an expanded view 250 of the Nth block 204. The Nth block includes 128 word lines, M bit lines, and 128*M transistors. Each transistor is coupled to one bit line and one word line, as illustrated in FIG. 2. Additionally, the bit lines may be coupled to a sense amplifier (SA) for use in reading data from the Nth block 204. The blocks 202 and 206-208 may have the same configuration as the Nth block 204.

One or more of the plurality of bit lines of the memory 104 may have a defect. In the illustrative example illustrated in FIG. 2, the first bit line 210, the second bit line 212, the fourth bit line 216, the fifth bit line 218, and the Mth bit line 222 may have open defects. To illustrate, the first bit line 210 may have a break 230, the second bit line 212 may have a break 232, the fourth bit line 216 may have a break 234, the fifth bit line 218 may have a break 236, and the Mth bit line 222 may have a break 238. As described with reference to FIG. 1, storage elements coupled to word lines on one side of the break may have a high likelihood of storing incorrect data, and storage elements coupled to word lines on the other side of the break do not have an increased likelihood of storing incorrect data. Because breaks may occur at different locations in bit lines, a break that affects one memory block may not affect another memory block. As an example, the break 238 on the Mth bit line 222 may be located in the 2Nth block 208. Memory blocks above the 2Nth block 208 (e.g., the first block 202—the Nth block 204) and the 2Nth block 208 may be affected by the break 238. Memory blocks below the break 238 (e.g., the (N+1)th block 206 to the (2N−1)th block) may not be affected by the break 238. Because the break 238 affects the first block 202 and not the (N+1)th block 206, bit line defect information corresponding to the first block 202 identifies the Mth bit line 222 as having a defect that affects the first block 202, and bit line defect information corresponding to the (N+1)th block 206 does not identify the Mth bit line 222 as having a defect that affects the (N+1)th block 206.

As described with reference to FIG. 1, bit line defect information may be stored for each block of the memory 104. For example, the first bit line defect information 134 may correspond to the first group of storage elements 103 (e.g., the first block 202), and the second bit line defect information 135 may correspond to the second group of storage elements 105 (e.g., a second block). Reliability information for the other blocks (e.g., blocks 3-2N) may also be stored in the dedicated portion 142 of the memory 104. The bit line defect information may include one or more identifiers of bit lines that have defects that affect a block of the memory 104 that is associated with the bit line defect information. For example, the first bit line defect information 134 may include a table that includes one or more identifiers of the bit lines 210-222 that affect the first block 202 (e.g., the first group of storage elements 103 of FIG. 1). Because the bit line defect information for the blocks 202-208 identifies bit lines having defects that affect the corresponding block (and not bit lines having defects that do not affect the corresponding block), the bit line defect information associated with the blocks 202-208 may be different than bit line defect information for the entirety of the memory 104. For example, the bit line defect information for the entirety of the memory 104 may include identifiers of the first bit line 210, the second bit line 212, the fourth bit line 216, the fifth bit line 218, and the Mth bit line 222 (and not the third bit line 214 and the sixth bit line 220), and the bit line defect information corresponding to one or more of the blocks 202-208 may be different.

To illustrate, bit line defect information that corresponds to the first block 202 identifies the fifth bit line 218 and the Mth bit line 222 (as having defects that affect the first block 202) and not bit lines 210-216 and 220. As another example, bit line defect information that corresponds to the Nth block 204 identifies the fifth bit line 218 (as having a defect that affects the Nth block 204) and not bit lines 210-216, 220, and 222. As another example, bit line defect information that corresponds to the (N+1)th block 206 identifies the first bit line 210, the second bit line 212, the fourth bit line 216, the fifth bit line 218, and the Mth bit line 222 (as having defects that affect the (N+1)th block 206) and not bit lines 214 and 220. As another example, bit line defect information that corresponds to the 2Nth block 208 identifies the fourth bit line 216, the fifth bit line 218, and the Mth bit line 222 (as having defects that affect the 2Nth block 208) and not bit lines 210-214 and 220. In this manner, the bit line defect information for each of the blocks of the memory 104 identifies bit lines having defects that affect the corresponding block (e.g., a subset of the bit lines having defects) instead of each bit line having a defect (e.g., bit lines 210, 212, 216, 218, and 222). Providing the bit line defect information to the soft bit generator 170 of FIG. 1 enables the soft bit generator 170 to generate more accurate sets of soft bits that that increase speed and reduce power consumption of the decoder 176 during decoding of data from the multiple blocks 202-208.

Figure 3:
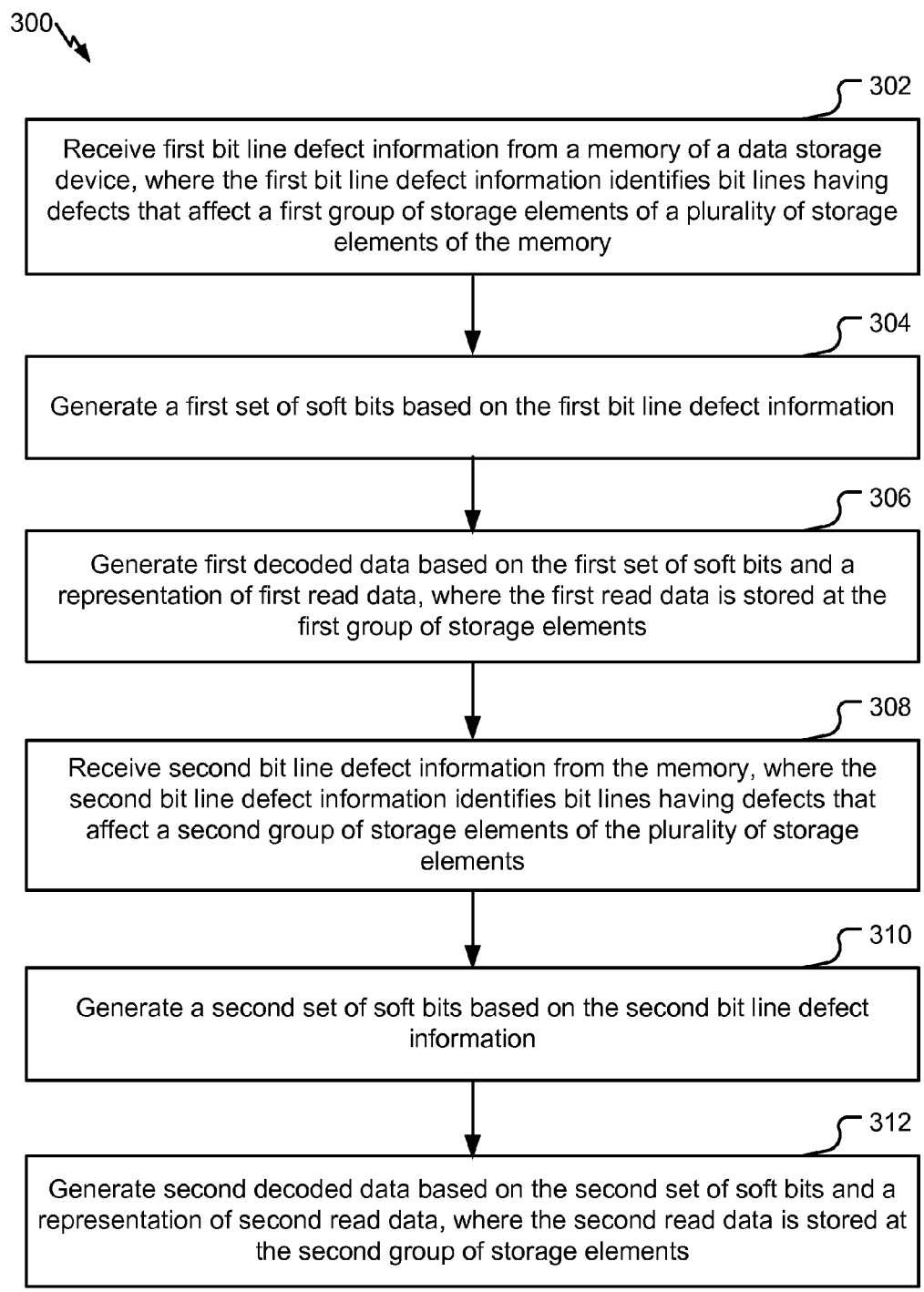
FIG. 3 is a flow diagram that illustrates a particular example of a method of operation of the controller of the data storage device of FIG. 1.

Referring to FIG. 3, a particular illustrative example of a method is depicted and generally designated 300. The method 300 may be performed at the data storage device 102, such as by the controller 120, the access device 150, or a combination thereof, as illustrative, non-limiting examples.

The method 300 may include receiving first bit line defect information from a memory, at 302. The first bit line defect information may identify bit lines having defects that affect a first group of storage elements of a plurality of storage elements of the memory. For example, the selection module 144 retrieves the first bit line defect information 134 that indicates bit lines having defects that affect the first group of storage elements 103, such as closed defects and open defects that affect the first group of storage elements 103, but not open defects that do not affect the first group of storage elements 103. The controller 120 receives the first bit line defect information 134 from the memory 104.

The method 300 may include generating a first set of soft bits based on the first bit line defect information, at 304. For example, the soft bit generator 170 may generate the first set of soft bits 172 based on the first bit line defect information 134 and sensed information associated with the first read data 132, as described with reference to FIG. 1. The first set of soft bits 172 may be provided to the decoder 176.

The method 300 may include generating first decoded data based on the first read data and the first bit line defect information, at 306. For example, the decoder 176 of the controller 120 generates the first decoded data 138 based on the representation of the first read data 132 and based on the first set of soft bits 172.

The method 300 may include receiving second bit line defect information from the memory, at 308. The second bit line defect information may identify bit lines having defects that affect a second group of storage elements of the plurality of storage elements. For example, the selection module 144 retrieves the second bit line defect information 135 that indicates bit lines having defects that affect the second group of storage elements 105, such as closed defects and open defects that affect the second group of storage elements 105, but not open defects that do not affect the second group of storage elements 105. The controller 120 receives the second bit line defect information 135 from the memory 104. Because at least one defect that affects the first group of storage elements 103 may not affect the second group of storage elements 105, the first bit line defect information 134 and the second bit line defect information 135 may be different.

The method 300 may include generating a second set of soft bits based on the second bit line defect information, at 310. For example, the soft bit generator 170 may generate the second set of soft bits 174 based on the second bit line defect information 135 and sensed information associated with the second read data 133, as described with reference to FIG. 1. The second set of soft bits 174 may be provided to the decoder 176.

The method 300 may include generating second decoded data based on the second read data and the second set of soft bits, at 312. For example, the decoder 176 of the controller 120 generates the second decoded data 139 based on the representation of the second read data 133 and based on the second set of soft bits 174.

In a particular implementation, the method 300 includes storing the first bit line defect information at a volatile memory of the controller if an address associated with the first group of storage elements is different than an address associated with a group of previously accessed storage elements. For example, if a first address that is included in the first request for data 130 corresponds to storage element(s) within the first group of storage elements 103, the controller may store the first bit line defect information 134 at the second memory 160. Additionally, the method 300 may include suppressing storage of additional bit line defect information in the volatile memory if a third group of storage elements associated with the additional bit line defect information is within the first group of storage elements. To illustrate, the controller 120 may receive additional bit line defect information in response to a third request for data corresponding to a third group of storage elements. If the third group of storage elements is within the first group of storage elements 103, the controller 120 suppresses storage of the additional bit line defect information in the second memory 160.

In a particular implementation, the method 300 includes sending a request to retrieve first read data from the memory. The request to retrieve the first read data may include an address corresponding to the first group of storage elements. The request to retrieve the first read data may also include a request for bit line defect information associated with the address. For example, the controller 120 sends the first request for data 130 to the memory 104. The first request for data 130 may include a first address that corresponds to storage element(s) within the first group of storage elements 103 of the memory 104. The first request for data 130 may also include a request for bit line defect information associated with the first address. In this implementation, the method 300 also includes, in response to sending the request to retrieve the first read data, receiving a representation of the first read data and the first bit line defect information from the memory. For example, in response to sending the first request for data 130, the controller 120 may receive the representation of the first read data 132 and the first bit line defect information 134.

Additionally, the method 300 may include receiving, from a host device, a data request. The data request may include a second address. The method 300 may further include determining whether the second address corresponds to the first group of storage elements, and, in response to determining that the second address corresponds to the first group of storage elements, sending a request to retrieve data stored at the second address to the memory. The request to retrieve the data stored at the second address may not include a request for bit line defect information. To illustrate, the controller 120 may receive a data request from the access device 150 and may determine whether an address included in the data request corresponds to the first group of storage elements 103. In response to determining that the address corresponds to the first group of storage elements 103, the controller 120 may send a third request for third read data to the memory 104. Because the first bit line defect information 134 (e.g., bit line defect information that corresponds to the address indicated by the data request) is already stored at the second memory 160, the controller 120 may not include a request for bit line defect information the third request.

In a particular implementation, the method 300 may further include decompressing the first bit line defect information prior to generating the first set of soft bits. For example, the compression module 178 may decompress the first bit line defect information 134 prior to providing the first bit line defect information 134 to the decoder 176.

By using bit line defect information for a particular group of storage elements of the memory 104 that identifies bit lines that have defects that affect the particular group of storage elements in a decoding process, the method 300 increases speed and reduces power consumption of the decoding process (e.g., generating the decoded bits) as compared to using bit line defect information for an entirety of the memory.

Figure 4:
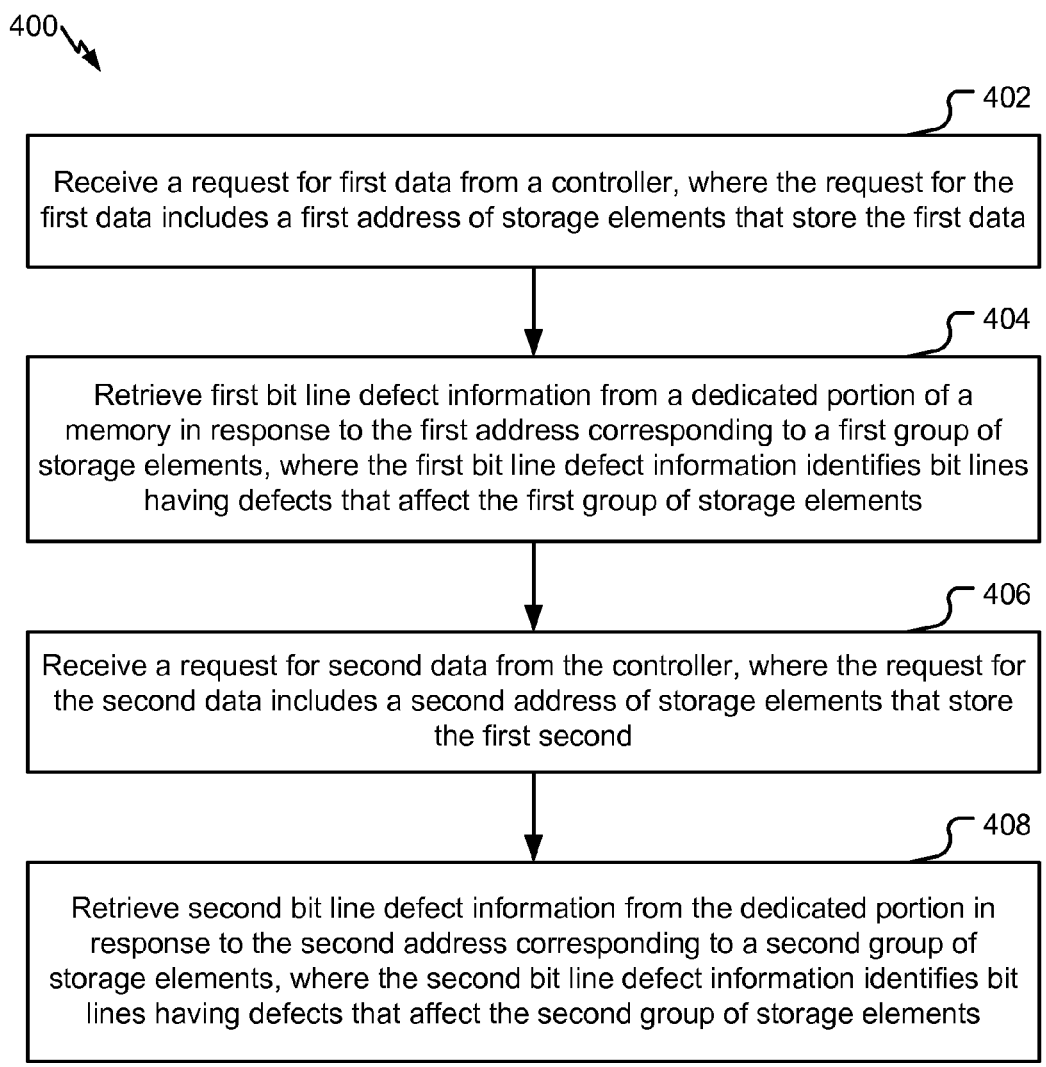
FIG. 4 is a flow diagram that illustrates a particular example of a method of operation of the memory of the data storage device of FIG. 1.

Referring to FIG. 4, a particular illustrative example of a method is depicted and generally designated 400. The method 400 may be performed at the data storage device 102, such as by a component in the memory 104. As an illustrative, non-limiting example, the method 400 may be performed by the selection module 144 of FIG. 1.

The method 400 may include receiving a request for first data from a controller, at 402. The request for the first data may include a first address of storage element(s) that store the first data. For example, the memory 104 may receive the first request for data 130 from the controller 120. The first request for data 130 may include a first address of storage element(s) that store the first read data 132, and the storage element(s) may be within the first group of storage elements 103 of the memory 104. The method 400 may include retrieving first bit line defect information from a dedicated portion of a memory in response to the first address corresponding to a first group of storage elements, at 404. The first bit line defect information may identify bit lines having defects that affect the first group of storage elements. For example, the selection module 144 may retrieve the first bit line defect information 134 from the dedicated portion 142 of the memory 104 in response to the first address corresponding to one or more storage elements within the first group of storage elements 103. The first bit line defect information 134 identifies bit lines having defects that affect the first group of storage elements 103 and not bit lines having defects that do not affect the first group of storage elements 103. In a particular implementation, the dedicated portion of the memory may include one or more read-only memory (ROM) fuses. In another particular implementation, the dedicated portion of the memory may include one or more single-level cell (SLC) storage elements.

The method 400 may include receiving a request for second data from the controller, at 406. The request for the second data may include a second address of storage element(s) that store the second data. For example, the memory 104 may receive the second request for data 131 from the controller 120. The second request for data 131 may include a second address of storage element(s) that store the second read data 133, and the storage element(s) may be within the second group of storage elements 105 of the memory 104. The method 400 may include retrieving second bit line defect information from the dedicated portion in response to the second address corresponding to a second group of storage elements, at 408. The second bit line defect information may identify bit lines having defects that affect the second group of storage elements. For example, the selection module 144 may retrieve the second bit line defect information 135 from the dedicated portion 142 of the memory 104 in response to the second address corresponding to the second group of storage elements 105 of the memory 104. The second bit line defect information 135 identifies bit lines having defects that affect the second group of storage elements 105 and not bit lines having defects that do not affect the second group of storage elements 105.

The method 400 enables a data storage device to provide bit line defect information corresponding to different groups of storage elements of a memory of the data storage device. The bit line defect information for a particular group of storage elements identifies bit lines having defects that affect the particular group of storage elements and not bit lines having defects that do not affect the particular group of storage elements. The more accurate bit line defect information enables a decoder that receives the bit line defect information to operate at an increased speed and with reduced power consumption when decoding data based on the bit line defect information.

The method 300 of FIG. 3 and/or the method 400 of FIG. 4 may be initiated or controlled by an application-specific integrated circuit (ASIC), a processing unit, such as a central processing unit (CPU), a controller, another hardware device, a firmware device, a field-programmable gate array (FPGA) device, or any combination thereof. As an example, method 300 of FIG. 3 and/or the method 400 of FIG. 4 can be initiated or controlled by one or more processors, such as one or more processors included in or coupled to a controller or a memory of the data storage device 102 and/or the access device 150 of FIG. 1. As an example, one or more of the methods of FIGS. 3 and 4, individually or in combination, may be performed by the controller 120 of FIG. 1. To illustrate, a portion of one of the methods FIGS. 3 and 4 may be combined with a second portion of one of the methods of FIGS. 3 and 4. Additionally, one or more operations described with reference to the FIGS. 3 and 4 may be optional, may be performed at least partially concurrently, and/or may be performed in a different order than shown or described.

In an illustrative example, a processor may be programmed to decode a representation of read data using bit line defect information that identifies bit lines having defects that affect a group of storage elements of a memory that stores the read data. For example, the processor may execute instructions to receive first bit line defect information from a memory. The first bit line defect information may identify bit lines having defects that affect a first group of storage elements of a plurality of storage elements of the memory. The processor may execute instructions to generate a first set of soft bits based on the first bit line defect information. The processor may further execute instructions to generate first decoded data based on the first set of soft bits and a representation of first read data. The first read data may be stored at the first group of storage elements.

Although various components of the data storage device 102 and/or the access device 150 of FIG. 1 are depicted herein as block components and described in general terms, such components may include one or more microprocessors, state machines, or other circuits configured to enable the various components to perform operations described herein. One or more aspects of the various components may be implemented using a microprocessor or microcontroller programmed to perform operations described herein, such as one or more operations of the method 300 of FIG. 3 and/or the method 400 of FIG. 4. In a particular implementation, each of the controller 120, the memory 104, the second memory 160, and/or the access device 150 of FIG. 1 includes a processor executing instructions that are stored at a memory, such as a non-volatile memory of the data storage device 102 or the access device 150 of FIG. 1. Alternatively or additionally, executable instructions that are executed by the processor may be stored at a separate memory location that is not part of the non-volatile memory, such as at a read-only memory (ROM) of the data storage device 102 or the access device 150 of FIG. 1.

With reference to FIG. 1, the data storage device 102 may be attached to or embedded within one or more access devices, such as within a housing of a communication device (e.g., the access device 150). For example, the data storage device 102 may be integrated within an apparatus, such as a mobile telephone, a computer (e.g., a laptop, a tablet, or a notebook computer), a music player, a video player, a gaming device or console, an electronic book reader, a personal digital assistant (PDA), a portable navigation device, or other device that uses non-volatile memory. However, in other embodiments, the data storage device 102 may be implemented in a portable device configured to be selectively coupled to one or more external access devices. In still other embodiments, the data storage device 102 may be a component (e.g., a solid-state drive (SSD)) of a network accessible data storage system, such as an enterprise data system, a network-attached storage system, a cloud data storage system, etc.

To further illustrate, the data storage device 102 may be configured to be coupled to the access device 150 as embedded memory, such as in connection with an embedded MultiMedia Card (eMMC®) (trademark of JEDEC Solid State Technology Association, Arlington, Va.) configuration, as an illustrative example. The data storage device 102 may correspond to an eMMC device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof. In yet another particular implementation, the data storage device 102 is coupled to the access device 150 indirectly, e.g., via a network. For example, the data storage device 102 may be a network-attached storage (NAS) device or a component (e.g., a solid-state drive (SSD) device) of a data center storage system, an enterprise storage system, or a storage area network.

The memory 104 and/or the second memory 160 of FIG. 1 may include a resistive random access memory (ReRAM), a three-dimensional (3D) memory, a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), or a combination thereof. Alternatively, or in addition, the memory 104 and/or the second memory 160 may include another type of memory. The memory 104 and/or the second memory 160 of FIG. 1 may include a semiconductor memory device.

Semiconductor memory devices include volatile memory devices, such as dynamic random access memory ("DRAM") or static random access memory ("SRAM") devices, non-volatile memory devices, such as magnetoresistive random access memory ("MRAM"), resistive random access memory ("ReRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of a non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor material such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically used for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional illustrative structures described but cover all relevant memory structures within the scope of the disclosure as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A data storage device comprising:
   a memory including a plurality of storage elements configured to store data, wherein the plurality of storage elements includes a first group of storage elements and a second group of storage elements; and
   a selection module configured to retrieve, in response to receiving a first address corresponding to the first group of storage elements, first bit line defect information affecting the first group of storage elements, wherein the first address is indicated by a first request for read data, and wherein the selection module is further configured to retrieve second bit line defect information affecting the second group of storage elements.

2. The data storage device of claim 1, wherein the memory is configured to store a table of bit line defect information, wherein a first entry in the table includes the first bit line defect information, and wherein a second entry in the table includes the second bit line defect information.

3. The data storage device of claim 1, wherein the selection module is configured to retrieve the second bit line defect information in response to a second address corresponding to the second group of storage elements, and wherein the second address is indicated by a second request for data.

4. The data storage device of claim 1, further comprising read/write circuitry configured to sense first read data stored at the first group of storage elements in response to a request for the first read data from a controller, wherein a representation of the first read data and the first bit line defect information are provided to the controller in response to the request for the first read data.

5. The data storage device of claim 4, wherein the first read data is sensed during a first time period, wherein the first bit line defect information is retrieved during a second time period, and wherein at least a portion of the second time period overlaps the first time period.

6. The data storage device of claim 1, wherein the memory includes read-only memory (ROM) fuses configured to store the first bit line defect information and the second bit line defect information.

7. The data storage device of claim 1, wherein the memory includes single-level cell (SLC) storage elements configured to store the first bit line defect information and the second bit line defect information, and wherein the memory comprises a non-volatile memory.

8. The data storage device of claim 1, wherein the selection module is configured to provide the first bit line defect information and the second bit line defect information to a soft bit generator of a controller.

9. A data storage device comprising:
   a memory including a plurality of storage elements; and
   a controller coupled to the memory, the controller configured to:
   receive first bit line defect information from the memory, wherein the first bit line defect information identifies bit lines having defects that affect a first group of storage elements of the plurality of storage elements;
   receive second bit line defect information from the memory, wherein the second bit line defect information identifies bit lines having defects that affect a second group of storage elements of the plurality of storage elements;
   generate a first set of soft bits based on the first bit line defect information; and generate a second set of soft bits based on the second bit line defect information.

10. The data storage device of claim 9, wherein the controller is configured to send a request for first read data to the memory and to receive a representation of the first read data and the first bit line defect information in response to sending the request for the first read data.

11. The data storage device of claim 10, wherein the controller is configured to send a request for second read data to the memory and to receive a representation of the second read data and the second bit line defect information in response to sending the request for the second read data.

12. The data storage device of claim 9, wherein the controller includes a decoder configured to generate first decoded data based on a representation of first read data and the first set of soft bits.

13. The data storage device of claim 9, wherein the controller includes a compression module configured to perform a data decompression operation on the first bit line defect information, the second bit line defect information, or a combination thereof.

14. A method comprising:
at a data storage device including memory and a controller coupled to the memory, wherein the memory includes a plurality of storage elements configured to store data, performing:
receiving first bit line defect information from the memory, wherein the first bit line defect information identifies bit lines having defects that affect a first group of storage elements of the plurality of storage elements; and
generating a first set of soft bits based on the first bit line defect information.

15. The method of claim 14, further comprising storing the first bit line defect information at a volatile memory of the controller if an address associated with the first group of storage elements is different than an address associated with a group of previously accessed storage elements.

16. The method of claim 15, further comprising suppressing storage of additional bit line defect information in the volatile memory if a third group of storage elements associated with the additional bit line defect information is within the first group of storage elements.

17. The method of claim 14, further comprising generating first decoded data based on the first set of soft bits and a representation of first read data, wherein the first read data is stored at the first group of storage elements.

18. The method of claim 17, further comprising:
receiving second bit line defect information from the memory, wherein the second bit line defect information identifies bit lines having defects that affect a second group of storage elements of the plurality of storage elements;
generating a second set of soft bits based on the second bit line defect information; and
generating second decoded data based on the second set of soft bits and a representation of second read data, wherein the second read data is stored at the second group of storage elements.

19. The method of claim 17, further comprising:
sending a request to retrieve first read data from the memory, wherein the request to retrieve the first read data includes an address corresponding to the first group of storage elements, and wherein the request to retrieve the first read data includes a request for bit line defect information associated with the address; and
in response to sending the request to retrieve the first read data, receiving a representation of the first read data and the first bit line defect information from the memory.

20. The method of claim 19, further comprising:
receiving, from a host device, a data request, wherein the data request includes a second address;
determining whether the second address corresponds to the first group of storage elements; and
in response to determining that the second address corresponds to the first group of storage elements, sending a request to retrieve data stored at the second address to the memory, wherein the request to retrieve the data stored at the second address does not include a request for bit line defect information.

* * * * *